United States Patent [19]

Wine

[11] 4,263,618
[45] Apr. 21, 1981

[54] TOUCH SWITCH ARRANGEMENT USEFUL IN A TELEVISION RECEIVER

[75] Inventor: Charles M. Wine, Princeton, N.J.

[73] Assignee: RCA Corporation, New York, N.Y.

[21] Appl. No.: 22,024

[22] Filed: Mar. 19, 1979

[51] Int. Cl.$^3$ .............................................. H04N 5/44
[52] U.S. Cl. .................................. 358/188; 307/116; 200/DIG. 1
[58] Field of Search .................. 358/188, 191.1, 193.1; 307/116, 360; 340/365 C, 531; 200/DIG. 1; 328/4, 5; 361/170, 181, 271, 278, 280, 328, 330; 331/65; 455/170, 179

[56] References Cited

U.S. PATENT DOCUMENTS

| | | | |
|---|---|---|---|
| 4,002,923 | 1/1977 | Larson | 307/116 |
| 4,110,748 | 8/1978 | Marino | 200/DIG. 1 |
| 4,125,783 | 11/1978 | Sefton | 307/116 |
| 4,125,794 | 11/1978 | Pohl | 315/362 |
| 4,136,291 | 1/1979 | Waldron | 307/308 |
| 4,176,575 | 12/1979 | Munch | 200/DIG. 1 |

OTHER PUBLICATIONS

"Advanced Product Description–S9260/S9261/S9263/S9264/S9265 Touch Control Interface" AMI, Inc. Sep. 1976.
"Advanced Product Description–S9262/S9266 Multiplexed Touch Control Interface" AMI, Inc. Sep. 1976.

Primary Examiner—Jin F. Ng
Assistant Examiner—Michael A. Masinick
Attorney, Agent, or Firm—Eugene M. Whitacre; Paul J. Rasmussen; Peter M. Emanuel

[57] ABSTRACT

User control apparatus for controlled systems includes a touch sensitive capacitive network for changing the amplitude of an alternating signal when contacted by a user and a control unit for controlling a predetermined function of the controlled system in response to a control signal representing amplitude changes of the alternating signal. A diode is connected in series between the touch sensitive capacitive network and wiring for connecting the touch sensitive capacitive network to the control unit. A filter capacitor is connected in shunt with the diode. The diode is poled to charge the filter capacitor to the peak amplitude of a predetermined portion of the alternating signal and also isolates the touch sensitive network from the capacitance of the filter capacitor and any stray capacitance associated with the wiring which may adversely affect the sensitivity of the touch sensitive capacitive network. When utilized in a television receiver, the alternating signals advantageously comprise pulses generated during deflection retrace intervals when the receiver's electron beams are normally blanked to reduce the visible effects of signals radiated from wiring between the source of alternating signals and the touch sensitive capacitive network.

6 Claims, 3 Drawing Figures

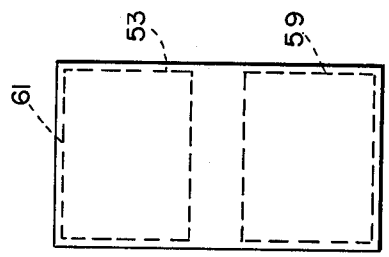
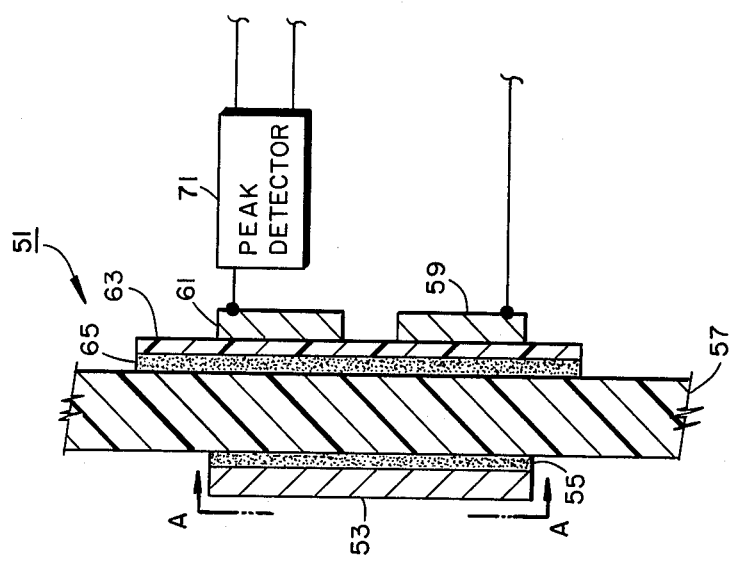
Fig. 3
Fig. 2

TOUCH SWITCH ARRANGEMENT USEFUL IN A TELEVISION RECEIVER

BACKGROUND OF THE PRESENT INVENTION

The present invention relates to the field of touch switch arrangements.

Many touch switch arrangements are known for controlling a variety of systems. Generally, touch switch arrangements may be categorized as either having or not having a direct electrical connection between a touch plate and the portion of the system to be controlled. The latter type may be more desirable than the former for use with systems, such as television receivers, which generate relatively high operating voltage and which may therefore require electrical isolation between user controls and the controlled portion.

Typically, touch switch arrangements which do not have a direct electrical connection between a touch plate and the controlled portion are of a capacitive type. In such arrangements, when a user touches a touch plate, the capacitance of a touch sensitive capacitive network is changed. A sense circuit detects the change in capacitance and causes the controlled portion to be appropriately controlled. This may, for example, be accomplished by detecting the change in amplitude of an alternating signal coupled through the touch sensitive capacitive network.

Serious consideration must be given to interconnections employed in capacitive types of touch switch arrangements. Interconnections may exhibit appreciable stray capacitances which may adversely affect the operation of touch switch arrangements. To ensure that stray capacitances associated with interconnections employed in capacitive type of touch switch arrangements are relatively low and relatively consistent from unit to unit, the interconnection configuration may be rigidly controlled, for example, by means of printed circuit techniques. In addition, to minimize the adverse effects of whatever stray capacitances remain, it may be necessary to employ special active sense circuits, such as keyed and differential amplifiers, preferably physically located in close proximity to the touch sensitive capacitive network.

Unfortunately, such measures may not be compatible with systems, such as television receivers, in which it is desired to incorporate as much active signal processing circuitry as possible in a single location, such as on a printed circuit board, to reduce cost and increase reliability by minimizing the number of connectors and interconnecting wires. Because of the physical configuration of television receivers, user controls are typically remotely located from the signal processing circuitry thereby necessitating relatively long interconnection wires. As a result, it is relatively difficult to rigidly control the interconnection configuration and impracticable to have active circuits near the user controls.

Not only do relatively long interconnecting wires have stray capacitances which may adversely affect the operation of capacitive touch switch arrangements, but in addition, relatively long interconnecting wires tend to radiate interference signals in response to alternating signals coupled through them to and from the capacitive touch switch arrangement which may adversely affect the performance of a television receiver itself. Thus, there is a requirement for touch switch arrangements of the capacitive type suitable for systems such as television receivers.

SUMMARY OF THE PRESENT INVENTION

In accordance with the present invention, a peak detector including a series connected unidirectional coupling device and a shunt connected filter capacitor is connected between a touch sensitive coupling network and the controlled portion of a system. An alternating signal is coupled through the capacitive coupling network with an amplitude dependent on whether or not a user has touched the touch sensitive network. The alternating signal is peak detected by the peak detector to generate a DC control signal for the controlled portion. The DC control signal is substantially unaffected by stray capacitance associated with interconnections between the peak detector and controlled portion, and the touch sensitive coupling network is effectively isolated from stray capacitance associated with the interconnections as well as the capacitance of the filter capacitor.

In accordance with another feature of the present invention, when employed in a television receiver, the alternating signal includes pulses generated by the receiver's deflection apparatus during retrace intervals of electron beam deflection signals when the receiver's electron beams are inhibited from producing visible images. In this manner, visible effects of interference signals radiated by interconnections for coupling the alternating signal to the touch sensitive capacitive network are reduced.

BRIEF DESCRIPTION OF THE DRAWING

FIGS. 2 and 3 show the mechanical configuration of a capacitive touch sensitive switch suitable for use in the arrangement shown in FIG. 1.

DETAILED DESCRIPTION OF THE DRAWING

Figure 1:
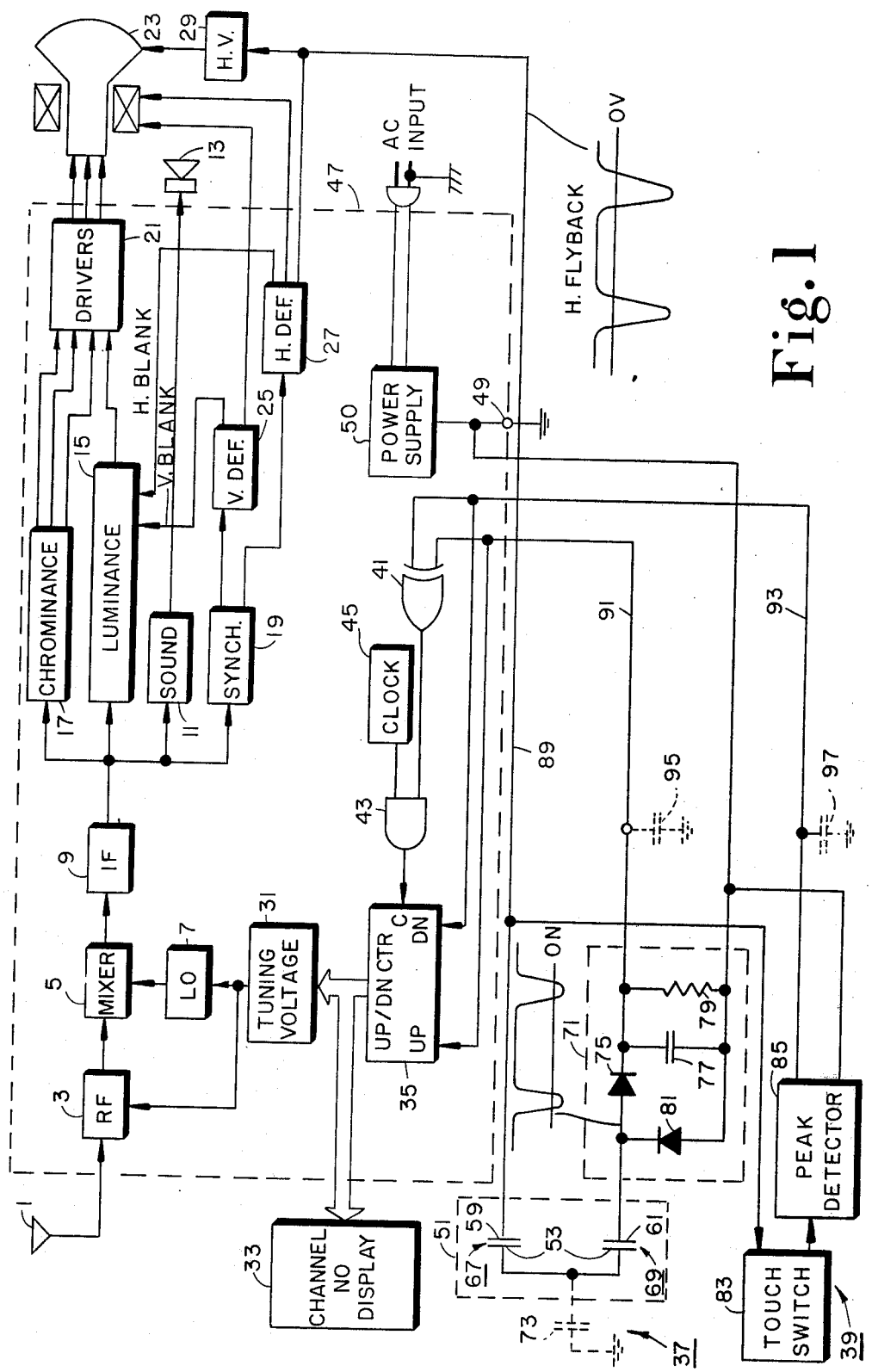
FIG. 1 shows partially in block diagram form and partially in schematic form a capacitive touch sensitive switch arrangement constructed in accordance with the present invention as it may be employed in a television receiver.

The receiver shown in FIG. 1 includes an antenna 1, an RF unit 3, a mixer 5 and a local oscillator 7 arranged to generate an IF signal. The IF signal is processed by an IF unit 9 to generate video and sound signal components. The sound signal component is processed by a sound signal processing unit 11 and coupled to a speaker 13. The video signal component is coupled to a luminance processing unit 15, a chrominance processing unit 17 and a synchronization processing unit 19. A luminance signal generated by luminance processing unit 15 and color difference signals generated by chrominance processing unit 17 are combined with the color difference signals by respective drivers 21 to form red, green and blue color signals. The color signals are coupled to a picture tube 23 which, in response, generates respective electron beams.

Synchronization processing unit 19 separates horizontal and vertical synchronization pulses from the video signal and couples these to vertical and horizontal deflection units 25 and 27, respectively. Deflection units 25 and 27 generate vertical and horizontal deflection signals for controlling the deflection of the electron beams. The electron beams are horizontally and vertically scanned and rescanned during respective trace and retrace intervals of the horizontal and vertical deflection signals. In addition, deflection units 25 and 27 generate respective vertical and horizontal blanking pulses during the vertical and horizontal retrace intervals, respectively. The blanking pulses are coupled to luminance processing unit 15 to cause the electron beams to be reduced in intensity so as not to produce visible lines during the vertical and horizontal retrace intervals. Horizontal deflection unit 27 also generates a horizontal flyback pulse during the horizontal retrace interval. The horizontal flyback pulse is coupled to a high voltage power supply 29 which generates the high operating voltage for picture tube 23.

Local oscillator 7 is a voltage controlled oscillator having an oscillation frequency controlled in response to a tuning voltage. RF unit 3 includes voltage controlled tuning elements also controlled in response to the tuning voltage so as to track the frequency response of local oscillator 7. The tuning voltage is generated by a tuning voltage generator 31 in response to binary signals representing a selected channel generated and stored by a channel number counter comprising an up/down counter 35. Tuning voltage generator 31 may, for example, include a phase locked loop frequency synthesizer such as described in U.S. Pat. No. 4,031,549, which is hereby incorporated by reference. The binary signals generated by up/down counter 35 are also coupled to a channel number display unit 33.

The portion of the receiver so far described may, for example, comprise a respective portion of an RCA CTC-92 color television chassis, described in "RCA Television Service Data, File 1978, C-4" published by RCA Corporation, Indianapolis, Ind., which is hereby incorporated by reference.

In the instant arrangement, a user may select a higher channel by touching a touch plate of a touch sensitive switch arrangement 37 and a lower channel by touching a touch plate of a touch sensitive switch arrangement 39. Touch sensitive switch arrangements 37 and 39 will be described in detail below. However, briefly, when the touch plate of either touch sensitive switch arrangements 37 and 39 is touched by a user, a respective low logic level signal is generated. In response, channel number counter 35 is enabled to count in the appropriate order and, by means of a logic network including an EXCLUSIVE OR gate 41 and an AND gate 43, clock pulses generated by a clock 45 are coupled to the clock (C) input of up/down counter 35. As long as the user touches one of the two touch plates, the contents of up/down counter 35 are appropriately increased or decreased and channels are sequentially tuned in the corresponding order.

With the exception of speaker 13, picture tube 23 and its deflection adjuncts, high voltage unit 29, channel number display 33 and touch switch arrangements 37 and 39, the various components of the receiver so far described are located within a main signal processing portion 47 of the receiver. The signal ground point for signal processing portion 47 is represented by terminal 49. The signal ground point may be coupled through a power supply 50 for signal processing portion 47 either indirectly through a transformer (not shown) or directly to AC neutral, which in turn is coupled to earth ground.

Since touch sensitive switch arrangements 37 and 39 include similar touch switch assemblies 51 and 83, respectively, and similar peak detectors 71 and 85, respectively, only touch switch arrangement 37 will be described in detail.

The mechanical configuration of touch sensitive switch assembly 51 is shown in a cross-sectional view in FIG. 2 and in a plan view, taken in the direction of section lines A—A of FIG. 2, in FIG. 3. Touch switch assembly 51 includes a first electrode comprising a conductive metal plate 53 mounted by means of an adhesive coating 55 on one side of a dielectric substrate 57. Desirably, dielectric substrate 57 is a portion of a plastic housing of the television receiver and plate 53 is mounted so as to be readily accessible to users. Second and third electrodes comprising conductive metal plates 59 and 61 are mounted on a relatively thin dielectric web 63 formed, for example, from Mylar. Web 63 is mounted on the side of dielectric substrate 57 opposite the side on which conductive plate 53 is mounted by means of an adhesive coating 65 so that plates 59 and 61 are generally within an area defined by the perimeter of plate 53. Dielectric substrate 57 electrically isolates users from relatively high operating voltages which may be generated within the receiver.

Electrically, plates 53, 59 and 61 are plates of two capacitors 67 and 69 connected in series as shown in FIG. 1. Capacitors 67 and 69 form a touch sensitive capacitive coupling network for coupling the horizontal flyback signal generated by horizontal deflection unit 27 to a peak detector 71. The output of peak detector 71 is coupled to EXCLUSIVE OR gate 41 and up/down counter 35. Peak detector 71 generates DC levels, with respect to signal ground 49, having amplitudes dependent on whether or not a user is touching plate 53. If plate 53 is not touched by a user, the horizontal deflection signal is coupled to peak detector 71 in a relatively unattenuated condition and the DC level generated by peak detector 71 has a relatively high amplitude. If a user touches plate 53, the junction of capacitors 67 and 69 is capacitively shunted to signal ground through the user's body as is indicated by a capacitor 73. As a result, the horizontal flyback signal is attenuated and the DC level generated by peak detector 71 has a relatively low amplitude. In this arrangement, since the user's body diverts only a portion of the horizontal flyback pulse from peak detector 71 rather than couple the horizontal flyback pulse to peak detector 71, it is not necessary to isolate the user from excessively high currents. Thus, it is not necessary to employ a series resistor to limit the amount of current flowing through a user's body. This is desirable since a series resistor would also tend to reduce the amplitude of the sensed signal.

Touch switch arrangements 37 and 39 are remotely located from signal processing portion 47 of the receiver. As a result, relatively long wires are connected between signal processing portion 47 and touch switch arrangements 37 and 39. The relatively long interconnection wires may tend to cause interference signals to be radiated to signal processing portion 47 in response to alternating signals coupled through them. The interference signals may adversely affect the operation of signal processing portion 47, for example, by producing visible spots in the picture.

The adverse effects of radiated interference signals due to the coupling of alternating signals to touch switch assemblies 51 and 83 through a wire 89 is considerably reduced in the receiver shown in FIG. 1 by utilizing the horizontal flyback signal as the alternating signal. This results because the relatively high frequency components of the horizontal flyback signal most likely to cause radiated interference signals are associated with the negative-going flyback pulses which occur during the horizontal retrace interval when the electron beams are normally inhibited from producing visible images. In addition, since the control signals generated by peak detectors 71 and 85 are essentially DC signals having, at steady state, either a low or high level, there are essentially no interference signals radiated from wires 91 and 93 which connect the inputs of touch switch arrangements 37 and 39, respectively, to signal processing portion 47.

In addition to radiated interference signals, because of the relatively long interconnection wires, stray capacitance associated with the wires may be significant compared with the capacitances associated with touch switch assemblies 37 and 39. While the lengths of the wires can to some degree be controlled during manufacture, their physical distance to other portions of the receiver, i.e., their so-called "lead dress", cannot be controlled as well. As a result, stray capacitance associated with the wires will not only tend to be significant but will also tend to be inconsistent from receiver to receiver.

Stray capacitances cause the attenuation and waveshape distortion of alternating signals. However, since the control signals generated by peak detectors 71 and 85 are essentially DC signals, the control signals are not affected, except during transitions, by stray capacitances, indicated by capacitors 95 and 97 associated with wires 91 and 93 connecting the outputs of peak detectors 71 and 85, respectively, to signal processing portion 47. In this respect, so that the horizontal flyback signal is not significantly affected by stray capacitances associated with wire 89, it is desirable that horizontal deflection unit 27 have a relatively low source impedance at the point where the horizontal flyback signal is generated.

Peak detectors 71 and 85 are also arranged to isolate touch switch assemblies 51 and 83 from stray capacitances 95 and 97 which may otherwise affect the capacitive coupling characteristics of touch switch assemblies 51 and 83 by attenuating the alternating signal coupled through them and thereby affect their sensitivity. Peak detector 71 includes a diode 75 connected in series between touch switch 51 and wire 91. A filter capacitor 77 is connected in shunt with the conjunction of diode 75 and filter capacitor 77. Diode 75 is poled to conduct in response to positive-going portions of the alternating signal coupled to it from touch switch assembly 51 and isolates touch switch assembly 51 from the stray capacitance 95 associated with wire 91 as well as the capacitance of filter capacitor 77. In order that diode 75 be most effective to isolate touch switch assembly 51 from undesired capacitance, it is desirable that it be physically mounted as close as possible to touch switch assembly 51. Filter capacitor 77 may be located physically near diode 75 or at a remote location such as the other end of wire 91, for example, within signal processing portion 47.

A load resistor 79 serves as a bleeder resistor for filter capacitor 77. A diode 81 is coupled in shunt with the junction of touch switch 51 and diode 75 and is poled to conduct in response to negative-going portions of the alternating signal coupled to it from touch switch assembly 51. When diode 81 is conductive, it discharges capacitors 67 and 69 so as to prevent a charge to be developed across capacitors 67 and 69 which would tend to keep diode 75 nonconductive even during positive-going signal portions.

In addition, diodes 81 and 75 and filter capacitor 77 are configured in a voltage doubler configuration which effectively causes the voltage developed across capacitor 77 to have an amplitude equal to the peak amplitude of the negative and positive portions of the alternating signal supplied by touch switch assembly 51. Thus, there is an amplification of the sensed signal without a power supply normally associated with active amplification circuits. Since touch switch arrangements 37 and 39 are remotely located from signal processing chassis, this is of particular advantage since power supply voltages need not be coupled to touch switch arrangements for purposes of amplification. Moreover, because of the amplification, the alternating signal coupled to touch switch assembly 51 may have, if desired, a relatively low amplitude.

What is claimed is:

1. User responsive control apparatus for controlling an associated system, comprising:
   a source of alternating signals;
   control means for controlling a predetermined function of said system in response to a control signal;
   touch sensitive means for coupling said alternating signal to said control means, said touch sensitive means including first and second capacitors connected in series and having first, second and common electrodes, said common electrode being accessible to a user, said touch sensitive means attenuating said alternating signal when said common electrode is touched by a user;
   first connection means for coupling said source of alternating signal to said first electrodes;
   second connection means for coupling said second electrodes to said control means, said second connection means exhibiting stray capacitances;
   a diode directly connected in series between said second electrode and said second connection means; and
   filter capacitor means coupled in shunt with the junction of said diode and said second connection means;
   said diode being poled to conduct in response to a predetermined polarity of said alternating signal to charge said filter capacitor means to thereby generate said control signal and also to isolate said touch sensitive means from the capacitance associated with said filter capacitor means and the stray capacitance associated with said second connection means.

2. The apparatus recited in claim 1 wherein:
   a second diode is coupled in shunt with the junction of said second electrode and said first diode and poled to conduct in response to the polarity of said output signal opposite said predetermined polarity.

3. The apparatus recited in claim 2 wherein:
   said system is a television receiver including electron beam generating means for generating at least one electron beam, deflection means for generating horizontal and vertical deflection signals each having trace and retrace intervals for controlling the deflection of said electron beam, and blanking means for inhibiting the generation of said electron beam during said retrace intervals; and
   said deflection means generates pulses during one of said horizontal and vertical retrace intervals, said pulses being coupled to said first electrode as said alternating signal.

4. The apparatus recited in claim 3 wherein:

said source of said alternating signal generates said pulses during said horizontal retrace interval.

5. The apparatus recited in claim 2 wherein:
said touch sensitive capacitive coupling network includes first, second and third conductive plates, said first conductive plate being mounted on a dielectric portion of said system exposed to users, said second and third conductive plates being mounted on the other side of said portion of said system generally within an area defined by the perimeter of said first plate, said first connection means being coupled to said second plate, said first-mentioned diode being directly connected to said third plate.

6. The apparatus recited in claim 5 wherein:
said first-mentioned means is mounted in close physical proximity to said third plate.

* * * * *